United States Patent
Fath et al.

(10) Patent No.: US 7,888,938 B2
(45) Date of Patent: Feb. 15, 2011

(54) GRADIENT COIL AND METHOD TO MANUFACTURE A GRADIENT COIL

(75) Inventors: Sascha Fath, Erlangen (DE); Ralph Kimmlingen, Nuremberg (DE); Johann Schuster, Oberasbach (DE); Lothar Schoen, Neunkirchen (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 116 days.

(21) Appl. No.: 12/354,299

(22) Filed: Jan. 15, 2009

(65) Prior Publication Data
US 2009/0179646 A1    Jul. 16, 2009

(30) Foreign Application Priority Data
Jan. 16, 2008    (DE) .................. 10 2008 004 660

(51) Int. Cl.
*G01V 3/00*    (2006.01)

(52) U.S. Cl. ........................ 324/318; 29/605

(58) Field of Classification Search ................ 324/318, 324/322; 29/605
See application file for complete search history.

(56) References Cited

U.S. PATENT DOCUMENTS

| 4,840,700 | A | * | 6/1989 | Edelstein et al. | ............ 216/22 |
| 4,847,985 | A | * | 7/1989 | Aubert | ................... 29/605 |
| 5,349,744 | A | * | 9/1994 | Takahashi | ............ 29/602.1 |
| 5,642,049 | A |   | 6/1997 | Harada et al. | |
| 6,311,389 | B1 | * | 11/2001 | Uosaki et al. | ............ 29/605 |
| 2002/0008516 | A1 |   | 1/2002 | Dietz et al. | |

* cited by examiner

*Primary Examiner*—Louis M Arana
(74) *Attorney, Agent, or Firm*—Schiff Hardin LLP

(57) ABSTRACT

In a gradient coil and a method to manufacture a gradient coil for a magnetic resonance apparatus, the gradient coil has at least one saddle coil, the saddle coil having a spatially shaped, electrically conductive plate with a line-shaped recess penetrating the plate. Conductor structures that create a gradient magnetic field in an examination region when a current signal flows therethrough are formed by the recess and by the shaping of the plate. The recess is filled with an electrically insulating material before implementation of the spatial shaping.

24 Claims, 2 Drawing Sheets

GRADIENT COIL AND METHOD TO MANUFACTURE A GRADIENT COIL

BACKGROUND OF THE INVENTION

1. Field of the Invention

The present invention concerns a gradient coil and a method for manufacturing a gradient coil.

2. Description of the Prior Art

A typical magnetic resonance apparatus has a gradient coil system that contains three (partial) gradient coils. For example, a magnetic field gradient in the X-direction is generated with the aid of a first gradient coil while a magnetic field gradient in the Y-direction is generated with the aid of a second gradient coil. Finally, a third gradient coil generates a magnetic field gradient in the Z-direction.

The XY gradient coils are known as "saddle coils" due to their shaped design.

It is known to design saddle coils with the use of bundled individual wires. For example, FIG. 3 shows such a saddle coil according to the prior art, which here is designed as part of a Y-gradient coil.

In this coil design, conductor loops that typically are formed of one to six bundled individual wires are fixed on a support plate—for example by adhesion. The individual wires of a conductor loop are insulated from one another with an enamel insulation layer, typically of $2\times10$ µm thickness. A common current signal flows through the individual wires of the conductor loop in order to form the Y-gradient field, or the Y-magnetic field, in an examination region of the magnetic resonance system.

Such saddle coils enable an optimized current density to be achieved in a predetermined central coil region in order to form the desired magnetic field in the examination region.

It is also known to fashion saddle coils using an electrically conductive plate. For example, elliptically running divider structures are milled as what are known as traces into the electrically conductive plate. The plate is subsequently brought into the saddle shape, for example by curving the plate in the form of a half-cylinder shell.

The traces can also be produced by cutting methods (water jet cutting methods or laser cutting methods, or by punching techniques, etc.

Conductor structures that, charged with a current signal, form a desired X-gradient field or Y-gradient field are formed via the curvature of the plate in the saddle shape and via the dividing traces.

The magnetic field efficiency is determined by a maximum achievable current density in a middle region of the plate. The requirement for a minimal insulation distance between the coil windings or, respectively, conductor structures therefore results in this middle region. Minimal conductor structure cross-sections are thereby necessary.

The power consumption of a gradient system from the mains network is determined by the ohmic resistance of the gradient coils. A requirement for a maximum cross-section of the respective conductor structures results from this in order to be able to use a mains power that is available only to a limited degree to the customer.

Given currents of 500 A to 1000 A that are typical today, in general 20 to 30 individual conductor loops result that are to be realized on the plate of the later saddle coil.

The advantage of a saddle coil produced from an electrically conductive plate is that the gradient coil possesses a very small resistance because a large-area conductive surface that is merely reduced by the width of the trace is available as a conductor structure. Depending on the technology, this trace can be very narrow—even only a few millimeters wide.

On both of the illustrated saddle coil designs, a distance (designated as a gap measurement) between the individual coil windings of the saddle coil is limiting.

Given use of an electrically conductive plate in the saddle coil design, the plate and its traces are compressed and expanded in the formation of the saddle shape. This shaping has a direct influence on the ratio of the trace width to the plate thickness. The thicker the plate, the larger a trace width that must be selected in order to prevent short circuits between the edges bordering the trace upon shaping.

In gradient coils known as microscopy gradient coils (with typical inner diameters of less than 100 mm), conductor structures are stamped in support structures that are as thin-walled as possible. Here copper cylinders with a wall thickness of $w<=1$ mm and a laser-cut gap measurement s of 0.2 mm are typical. Here the problem of the compression and expansion of a saddle coil does not occur.

In contrast to this, in whole-body gradient coils (with typical inner diameters of greater than 600 mm) the gradient axes are produced from multiple partial coils. Due to the effort, here methods have been achieved that assume a flat plate.

SUMMARY OF THE INVENTION

An object of the present invention is to provide a saddle coil for a gradient coil as well as a method for its manufacture, in which the saddle coil can be used with a high current density in order to be able to form a desired usable field in an examination region, and in which the saddle coil exhibits a reduced power loss.

The saddle coil according to the invention is part of a gradient coil of a magnetic resonance apparatus.

The gradient coil is preferably fashioned as a cylindrical whole-body coil that is suitable to accommodate a majority of the human body.

As noted above, the saddle coil has an electrically conductive plate in which at least one line-shaped recess is introduced.

With the recess and with ensuing shaping of the plate for the saddle shape, conductor structures are formed that, charged with a current signal, create a gradient magnetic field.

Before shaping the plate, the recess is filled with an electrically insulating material so that the insulation material remains in the recess upon the ensuing shaping.

The saddle coil according to the invention enables the realization of high current densities with low power losses; high current densities can be achieved.

DESCRIPTION OF THE PREFERRED EMBODIMENTS

Figure 1:
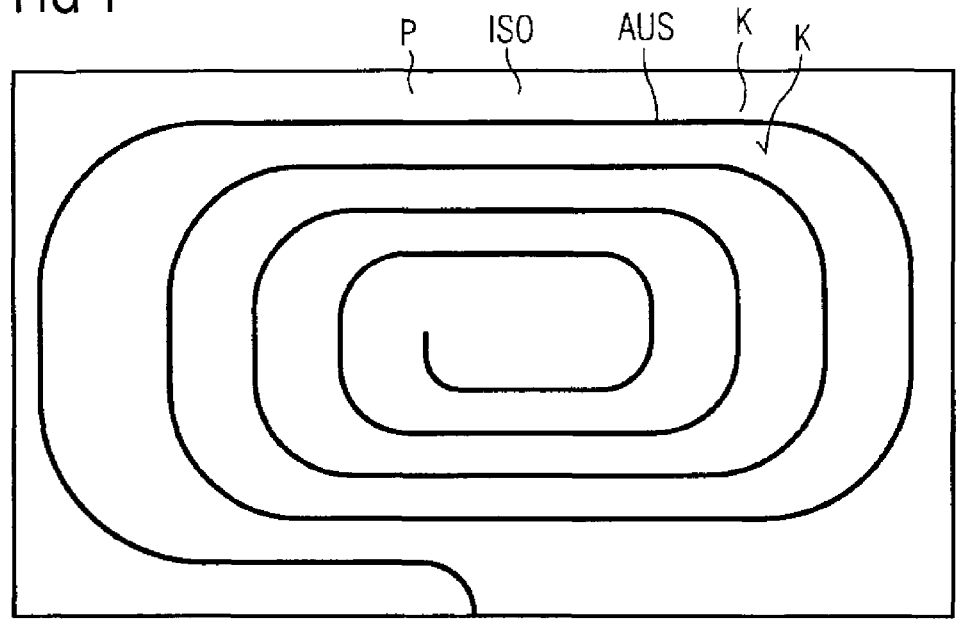
FIG. 1 shows a saddle coil according to the invention before shaping thereof, in plan view.

FIG. 1 shows a saddle coil according to the invention before its shaping in a plan view.

A recess AUS is introduced into an electrically conductive plate P that is preferably produced from copper or aluminum.

The recess AUS is bounded on each plate side by two edges K.

For example, the recess AUS is introduced into the plate P with the aid of milling methods, punching methods, laser cutting or water jet methods etc.

The recess AUS is then filled with an insulating material ISO; this is glued therein, for example.

It is possible to introduce the insulating material into the recess AUS via casting or via spackling etc.

Figure 2:
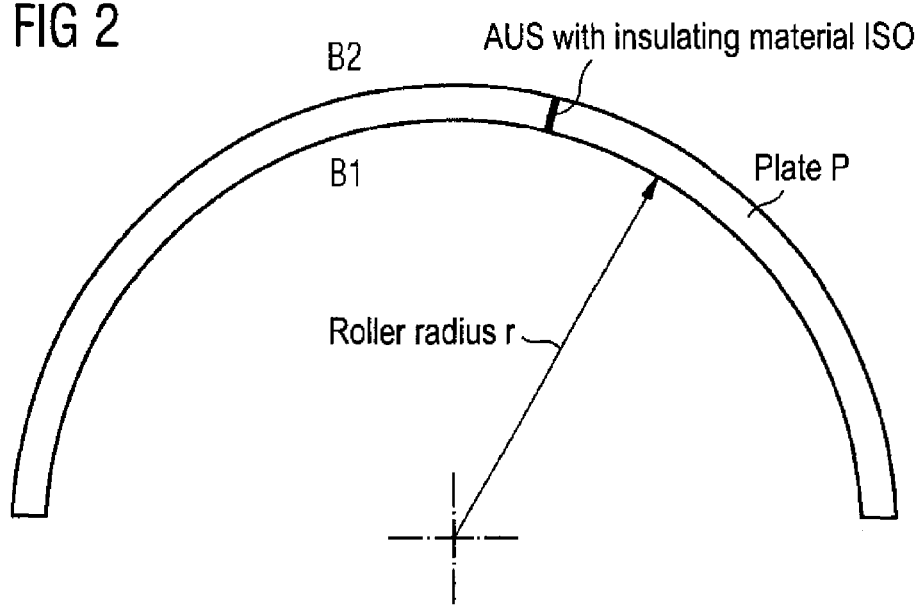
FIG. 2 shows a shaped saddle coil according to the invention in a side view.
Figure 3:
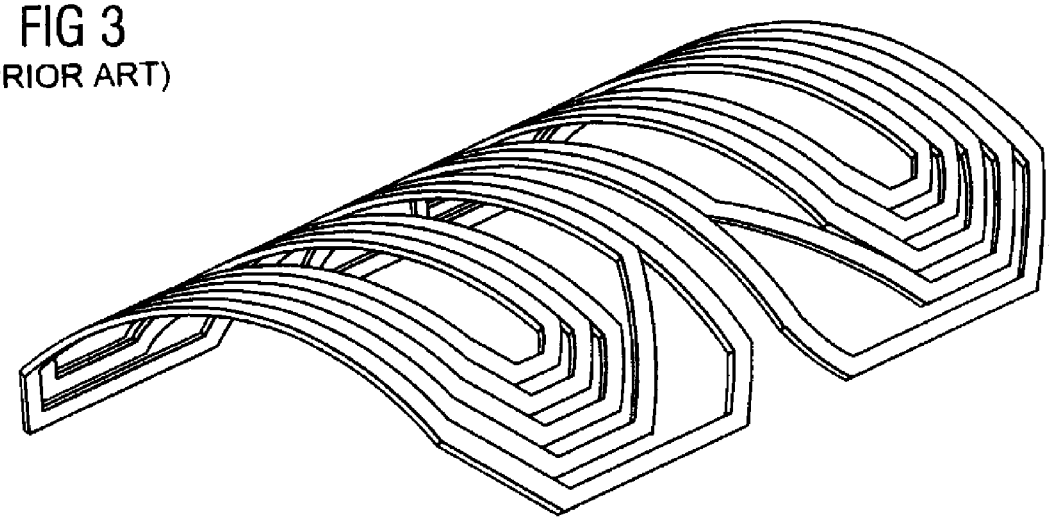
FIG. 3 shows a shaped saddle coil according to the prior art, in a side view.

The plate P is then curved in the shape of a saddle as shown in FIG. 2. For example, the plate P is shaped into a half-cylinder shell using a rolling radius r.

First regions B1 of the plate P are compressed while second regions B2 of the plate P are expanded via this shaping, which preferably ensues at room temperature.

The electrically insulating material ISO in the recess AUS prevents the edges K (which bound the recess AUS on the plate side) from forming a short with one another upon shaping. These shorts are known as "winding shorts".

Respective coil windings are therefore reliably insulated from one another in the shaped saddle coil.

The insulating material ISO is preferably executed as an insulating, highly flexible casting compound. For example, epoxy resins or polyurethanes are suitable.

In a preferred development, the insulating material ISO contains particles as a filling material. The particles are preferably mineral particles or plastic particles (for example thermoplastic or duroplastic).

For example, particles made from silica, fused silica or glass can be used.

The particles preferably exhibit a particle size that is matched to the width of the recess AUS. The particles are therefore ideally large enough to reliably avoid (due to their particle size) the winding short, and they are on the other hand small enough in order to be able to fill the recess AUS without problems upon processing.

In a preferred embodiment, an additional layer or plate is permanently attached (not shown in detail here) on at least one side of the plate P. For example, said additional layer or plate is affixed with a gluing process.

This procedure allows the insulating material ISO to be introduced into the recess AUS with, for example, the use of a spatula without being able to drip onto an opposite side.

A uniform filling of the recess AUS with the insulating material ISO is achieved via this additional layer or plate.

The affixing of the additional, electrically insulating plate on the electrically conductive plate P advantageously assists in the edges K having no winding short.

If both faces of the plate P each have an additional electrically insulating plate, insulating layers that have previously been required in a further layered design of the gradient coil system can advantageously be omitted.

The recess AUS (and therefore the insulating distance) particularly advantageously have a width BR $\leq$1 mm given typically used plate thicknesses of 3 mm to 5 mm.

In an additional embodiment it is possible to embed the plate P flat in a casting compound. Insulation layers can therefore be omitted at subsequent layers of additional coils of the gradient coil system.

Although modifications and changes may be suggested by those skilled in the art, it is the intention of the inventors to embody within the patent warranted hereon all changes and modifications as reasonably and properly come within the scope of their contribution to the art.

We claim as our invention:

1. A gradient coil for a magnetic resonance apparatus comprising:

an electrically conductive plate having a line-shaped recess therein that penetrates the plate, said recess defining a conductor structure on said plate that, when supplied with current, generates a gradient magnetic field for magnetic resonance imaging, said plate with said conductor structure thereon being spatially shaped to form a saddle coil; and electrically insulating material having a material composition allowing said electronically insulating material to fill said recess before spatially shaping said plate, and said electrically insulating material being configured in said recess in order to prevent winding shorts from occurring during said spatial shaping of said plate and said conductor structure thereon.

2. A gradient coil as claimed in claim 1 wherein said saddle coil is configured to form a whole-body coil.

3. A gradient coil as claimed in claim 1 wherein said recess has two edges at each side of said plate, said edges being maintained at a distance from each other by said insulating material to prevent a winding short between said edges from occurring during said spatial shaping of said plate and said conductor structure thereon.

4. A gradient coil as claimed in claim 1 wherein said insulating material is glued into said recess.

5. A gradient coil as claimed in claim 1 wherein said plate with said conductor structure thereon is shaped at room temperature using a rolling radius.

6. A gradient coil as claimed in claim 1 wherein said insulating material comprises a resilient casting compound.

7. A gradient coil as claimed in claim 1 wherein said insulating material contains filling material particles.

8. A gradient coil as claimed in claim 7 wherein said particles are selected from the group consisting of mineral particles, thermoplastic particles, silica particles, fused silica particles, and glass particles.

9. A gradient coil as claimed in claim 7 wherein said particles have a particle size that prevents winding shorts from occurring between portions of said conductor structure during spatially shaping of said plate with said conductor structure thereon.

10. A gradient coil as claimed in claim 1 comprising an additional electrically insulating layer attached at one side of said plate, that prevents winding shorts from occurring during the spatial shaping of said plate with said conductor structure thereon.

11. A gradient coil as claimed in claim 1 wherein said plate has a plate thickness in a range between 3 mm and 5 mm, and wherein said recess has a width less than or equal to 1 mm.

12. A gradient coil as claimed in claim 1 comprising casting compound in which said plate with said conductor structure thereon is embedded before spatially shaping said plate with said conductor structure thereon.

13. A gradient coil as claimed in claim 1 wherein said line-shaped recess has an elliptical shape.

14. A gradient coil as claimed in claim 1 wherein said plate is comprised of material selected from the group consisting of copper and aluminum.

15. A method for manufacturing a gradient coil for a magnetic resonance apparatus comprising:

providing an electrically conductive plate having a line-shaped recess therein that penetrates the plate;

using the line-shaped recess, forming a conductor structure on said electrically conductive plate;

filling said line-shaped recess with insulating material; and after filling line-shaped recess with said insulating material, spatially shaping said electrically conductive plate with said conductor structure thereon to form a saddle coil that generates a gradient magnetic field for magnetic resonance imaging when a current is supplied to said conductor structure.

16. A method as claimed in claim 15 comprising configuring said saddle coil for use as whole-body coil.

17. A method as claimed in claim 15 comprising forming said recess in said plate so as to be bounded by two edges at each side of the plate, and forming said recess with said edges at a distance from each other maintained by said insulating material to prevent a winding short between said edges from occurring during spatial shaping of said plate with said conductor structure thereon.

18. A method as claimed in claim 15 comprising gluing said insulating material into said recess.

19. A method as claimed in claim 15 comprising shaping the plate with the conductor structure thereon at room temperature using a rolling radius.

20. A method as claimed in claim 15 comprising employing a resilient casting compound as said insulating material.

21. A method as claimed in claim 15 comprising adding filling material particles to said insulating material.

22. A method as claimed in claim 21 comprising employing particles, as said filing material particles, having a particle size that prevents winding shorts from occurring during spatial shaping of said plate with said conductor structure thereon.

23. A method as claimed in claim 15 comprising providing an additional, electrically insulating layer at one side of said plate, that prevents winding shorts from occurring during spatial shaping of said plate with said conductor structure thereon.

24. A method as claimed in claim 15 comprising embedding said plate with said conductor structure thereon in casting compound before spatially shaping said plate with said conductor structure thereon.

* * * * *